United States Patent
Von Staudt et al.

(10) Patent No.: US 7,609,079 B2
(45) Date of Patent: Oct. 27, 2009

(54) PROBELESS DC TESTING OF CMOS I/O CIRCUITS

(75) Inventors: Hans Martin Von Staudt, Weilheim (DE); Tony Coffey, Highworth (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 334 days.

(21) Appl. No.: 11/366,742

(22) Filed: Mar. 2, 2006

(65) Prior Publication Data
US 2007/0208526 A1    Sep. 6, 2007

(30) Foreign Application Priority Data
Mar. 2, 2006    (EP)    .................................. 06392003

(51) Int. Cl.
*G01R 31/02*    (2006.01)
(52) U.S. Cl. ...................................... 324/763
(58) Field of Classification Search ........................ None
See application file for complete search history.

(56) References Cited

U.S. PATENT DOCUMENTS

| | | | |
|---|---|---|---|
| 5,365,200 A * | 11/1994 | Honnigford et al. ......... | 324/144 |
| 6,262,585 B1 | 7/2001 | Frodsham et al. | |
| 6,515,500 B1 * | 2/2003 | Okuda ......................... | 324/765 |
| 6,681,193 B2 * | 1/2004 | Dallavalle .................... | 324/763 |
| 6,725,171 B2 | 4/2004 | Baur et al. | |
| 6,774,647 B2 * | 8/2004 | Kash et al. ................... | 324/752 |
| 6,774,656 B2 | 8/2004 | Baur et al. | |
| 6,797,550 B2 * | 9/2004 | Kokubo et al. ............... | 438/164 |
| 7,235,997 B2 * | 6/2007 | Huang ......................... | 324/769 |
| 2002/0029124 A1 * | 3/2002 | Dallavalle .................... | 702/117 |
| 2002/0078400 A1 | 6/2002 | Baur et al. | |
| 2003/0224550 A1 * | 12/2003 | Kokubo et al. ................ | 438/48 |
| 2006/0012391 A1 * | 1/2006 | Huang ......................... | 324/769 |
| 2006/0186946 A1 * | 8/2006 | Hughes ....................... | 327/427 |
| 2007/0208526 A1 * | 9/2007 | Staudt et al. ................. | 324/765 |

FOREIGN PATENT DOCUMENTS

JP    06160487 A    *    6/1994

OTHER PUBLICATIONS

"Verification and auto test for LCD driver/controller", Li Zhuo et al., IEEE 2000, Proc. 5th Int'l Conf. on ASIC, Oct. 2003, vol. 2, pp. 1175-1178.
"I/O Self-Leakage Test", by Ali Muhtaroglu et al., 2004 ITC Int'l Test Conf., Charlotte, NC, Oct. 26-28, 2004.
Piscataway, NJ, USA, IEEE, Oct. 26, 2004, pp. 903-906, XP010763697, ISBN: 0-7803-8580-2.

* cited by examiner

*Primary Examiner*—Jermele M Hollington
(74) *Attorney, Agent, or Firm*—Saile Ackerman LLC; Stephen B. Ackerman

(57) ABSTRACT

A method and implementation is described by which I/O input and output circuitry of a CMOS chip are measured without the need to probe the chip. Output driver transistors are used to provide marginal voltages to test input circuits, and the output driver transistors are segmented into portions where a first portion is used to provide a representative "on" current, which is coupled to a test bus that is further connected to a current comparator circuit contained within the chip. Both leakage and "on" current of the driver transistors is measured using segmented driver transistors. The output of the current comparator circuit is connected to a test scan register or to a test output from which test results are obtained digitally. The testing techniques are also applicable for other semiconductor devices.

25 Claims, 14 Drawing Sheets

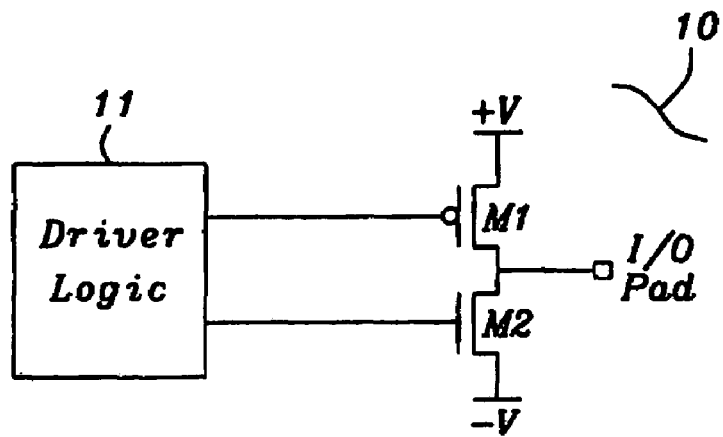
FIG. 1A – Prior Art
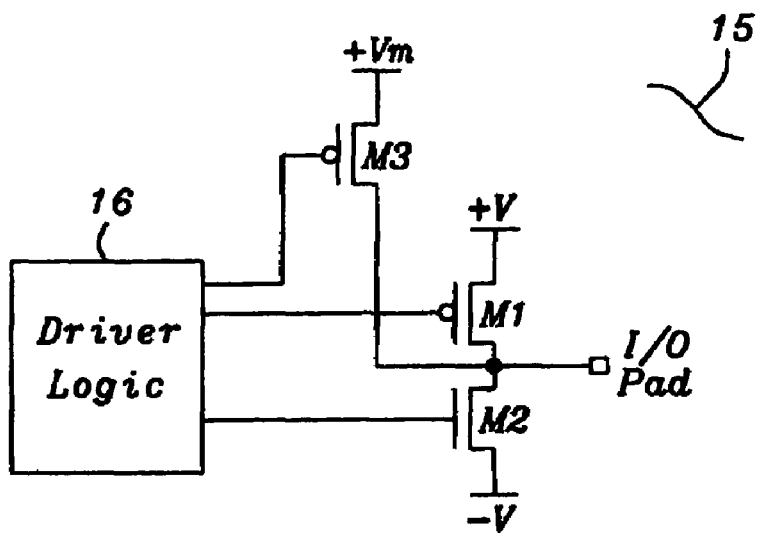
FIG. 1B – Prior Art

To Selector

US 7,609,079 B2

PROBELESS DC TESTING OF CMOS I/O CIRCUITS

BACKGROUND OF THE INVENTION

1. Field of Invention

The present invention is related to semiconductor testing, and in particular to testing CMOS I/O drivers.

2. Description of Related Art

As the integration of semiconductor chips continues, smaller and smaller geometries have occurred with more and more I/O circuits included to reduce the number of chips needed to implement a function. With the onset of advancement in displays creating LCD screens and other methods of display, the need for testing the ability of the I/O drive circuits to perform a specified function is necessary to guarantee the quality of the drivers. Driver leakage current testing as well as drive current capability is crucial to guarantee a quality display to insure segment and common connections to a display create a quality image.

A paper title "Verification and Auto Test for LCD Driver/Controller", Zhuo et al., Proceedings 5th International Conference on ASIC, October 2003, Vol.: 2, pp.: 1175-1178 is directed to two methods that fulfill the voltage measurements for all terminals of an LCD driver using several A/D converters. U.S. Pat. No. 6,774,656 (Baur, et al.) is directed to a self-test for leakage current of driver/receiver stages. U.S. Pat. No. 6,725,171 (Baur, et al.) is directed to a self-test structure with a split, asymmetric controlled driver output stage. U.S. Pat. No. 6,262,585 (Frodsham, et al.) is directed to an apparatus for I/O leakage self-test in an integrated circuit.

In FIG. 1A is shown a driver circuit 10 of prior art, which comprises a driver logic 11, a P-channel transistor M1 and an N-channel transistor M2. The drain of transistor M2 is connected to the drain of transistor M1, which is further, connected to a chip I/O pad. A bias voltage +V is connected to the P-channel transistor M1 and a bias voltage −V is connected to the source of the N-channel transistor M2. The driver logic 10 controls the gates of M1 and M2 to produce at the I/O pad an output voltage and current to necessary to drive an LCD display or other electronic equipment. Testing of the driver circuit 10 requires probing of the I/O pad with a tester while manipulating the driver logic 11 to produce the required test conditions.

In FIG. 1B is shown a driver circuit 15 of prior art, which comprises the driver logic 16 controlling the gates of a first P-channel transistor M1, a second P-channel transistor M3 and an N-channel transistor M2. The drains of transistors M1 and M3 are connected to the drain of transistor M2 and further connected to a chip I/O pad. Transistor M1 is biased with a voltage +V, transistor M2 is biased with a voltage −V and transistor M3 is biased with a voltage +Vm. Testing of the driver circuit 15 requires probing of the I/O pad with a tester while manipulating the driver logic 16 to produce the required test conditions.

The probing of the small I/O pads of an integrated circuit chip by a tester exposes the I/O pad to damage, which creates problems for electrically connecting the I/O pads to the next higher level of assembly. A design and method is required to eliminate this exposure and still provide a means for efficiently testing the quality of the I/O drivers including leakage and drive current.

SUMMARY OF THE INVENTION

It is an objective of the present invention to provide an implementation and method to allow testing of an I/O driver circuit and I/O receiver circuit without the probing of a semiconductor chip I/O pad to which the drive circuit is connected.

It is also an objective of the present invention to segment the gate of the transistors forming I/O driver circuit into two or more portions, one of which is used to create a test transistor to produce a representative driver output load current at a reduced current level.

It is further an objective of the present invention to control all gate segments of each driver transistor to produce current in normal operation.

It is also further an objective of the present invention to measure leakage current and drive current of CMOS transistors forming an I/O driver circuit using a current comparator circuit within an integrated circuit chip containing the I/O drive circuit.

It is still further an objective of the present invention to connect the output of the current comparator to a primary output (e.g. by multiplexing) or to a test scan register to allow scanning out driver current test results.

It is also still further an objective of the present invention to couple a plurality of I/O driver circuits within a semiconductor chip to a test bus contained within the semiconductor chip and switch test current from each transistor of the I/O driver circuits to the test bus and a current comparator circuit connected to the test bus.

It is another objective of the present invention to connect the test current to the test bus using a switch circuit connected to each chip output pad connected to an I/O driver circuit.

In the present invention the control gates of CMOS output driver transistors are segmented into two or more portions forming two or more transistors sharing the same semiconductor device channel. The first of the portions is used as a test transistor to provide a means by which the drive current of the CMOS driver can be tested. The other portions are controlled with the first portion to produce drive current in the regular operation of the driver transistor. The ratio of the first portion (the test transistor) to the other portions is any suitable ratio that keeps the test current within acceptable limits but high enough to provide sensible results. The portions of the segmented control gate can be grouped in various ways, for example interleaving the first portion (test portion) with the other portions so as to provide an approximate even distribution of the portions over the total surface of driver transistor control gate area or grouped in clusters of segmented elements forming the control gate portions.

The CMOS driver is comprised of a P-channel transistor and an N-channel transistor connected together to an output pad of a semiconductor chip. The P-channel transistor is biased with a positive voltage and the N-channel transistor is biased with a negative voltage. Both the P-channel driver and the N-channel driver are made with segmented control gates where the test transistor portion of each is controlled by a test logic through a selector circuit. During normal operation driver logic controls all segments of the control gates through the selector. Additional segmented driver transistors biased by the same or different voltages can be added to the driver circuit and control in a similar fashion by the driver logic and test logic through a selector circuit.

A switch controlled by the test logic connects the output pad of the chip to a test bus that is connected to the current measuring circuit. The current measuring circuit is a current comparator circuit, which couples the compare results to a test scan register. All the output driver circuits connected to an I/O pad are further connected from the I/O pad to the current comparator circuit by a switch. Selecting a switch coupled to an output driver connects the output driver to the current comparator circuit. A test pad connected to the test bus can be used to allow a tester to measure test current form the output drivers.

Leakage current from the P-channel driver transistor or the N-channel driver transistor of an output drive circuit is measured by biasing each driver transistor separately and closing the switch connecting a particular drive circuit to the test bus. then the current comparator or tester connected to the test pad is used to measure the leakage current. If all switches connected to the test bus are closed simultaneously, a collective output driver leakage current from the N-channel transistors or the P-channel transistors can be measured. If the collective leakage is below a predetermined amount, further testing of the individual driver circuits for leakage is not necessary.

Drive current from the P-channel driver transistor, or the N-channel driver transistor, is accomplished by biasing the particular driver transistor and controlling one of the control gate test segments to be on, closing the switch connecting the I/O pad to the test bus and comparing the resulting current with the current comparator, or by measuring the resulting current with a tester connected to a test pad connected to the test bus.

Another way to couple drive current from the P-channel driver transistor, or the N-channel driver transistor, is to bias the particular driver transistor or one of its segments, reconfigure (by switches) a portion or the whole compliment transistor as the sensing transistor of a current mirror, and connect the sensing transistor to a mirror transistor with a low current switch device. The corresponding mirror transistor, which can be of much smaller size than the sensing transistor, couples a proportional current to a test bus to which the current comparator is connected.

BRIEF DESCRIPTION OF THE DRAWINGS

This invention will be described with reference to the accompanying drawings, wherein:

FIG. 1A is a diagram of prior art of an I/O driver circuit;

FIG. 1B is a diagram of prior art of an I/O driver circuit containing an additional driver transistor and bias voltage;

DETAILED DESCRIPTION OF THE PREFERRED EMBODIMENT

Figure 2A:
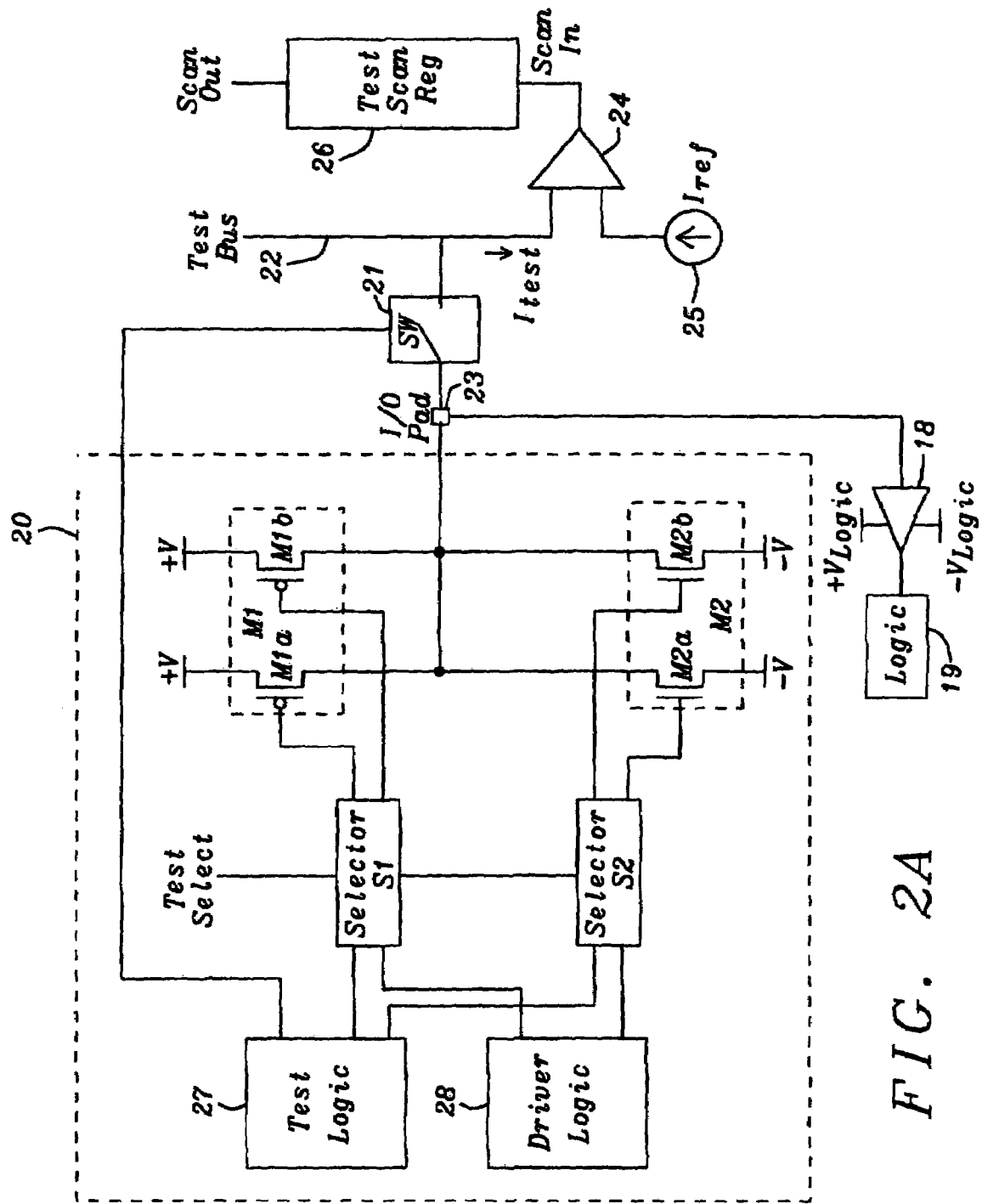
FIGS. 2A and 2B are diagrams of an I/O driver circuit of the present invention.

In FIG. 2A is shown a circuit diagram of an I/O receiver circuit 18 coupled to logic circuits 19 and an output driver circuit 20 coupled to an I/O pad 23. The output driver circuit 20 is coupled by a switch 21 to a test bus 22. The output driver 20 comprises a P-channel transistor M1 and an N-channel transistor M2. The control gates of transistors M1 and M2 are segmented into a plurality of control gate portions forming a plurality of transistors sharing the same transistor device channel. For simplicity of explanation the segmentation of the transistors M1 and M2 is assumed to be two portions. Thus, the control gate of M1 is shown to be segmented into two portions forming transistor M1$a$ and M1$b$, in like manner the control gate of M2 is shown to be segmented into two portions forming transistors M2$a$ and M2$b$. By definition herein transistors M1$b$ and M2$b$ are test transistors, and M1$b$ and M2$b$ have a gate area that is a fraction of the total gate area of M1$a$ plus M1$b$ and M2$a$ plus M2$b$, respectively. FIG. 2C shows an example of a control gate layout comprising an interleave of the two portions of the control gate metallization, where metallization 40 represents the control gate for transistors M1$b$ and M2$b$ and metallization 41 represents the control gate for transistors M1$a$ and M2$a$.

Figure 2B:
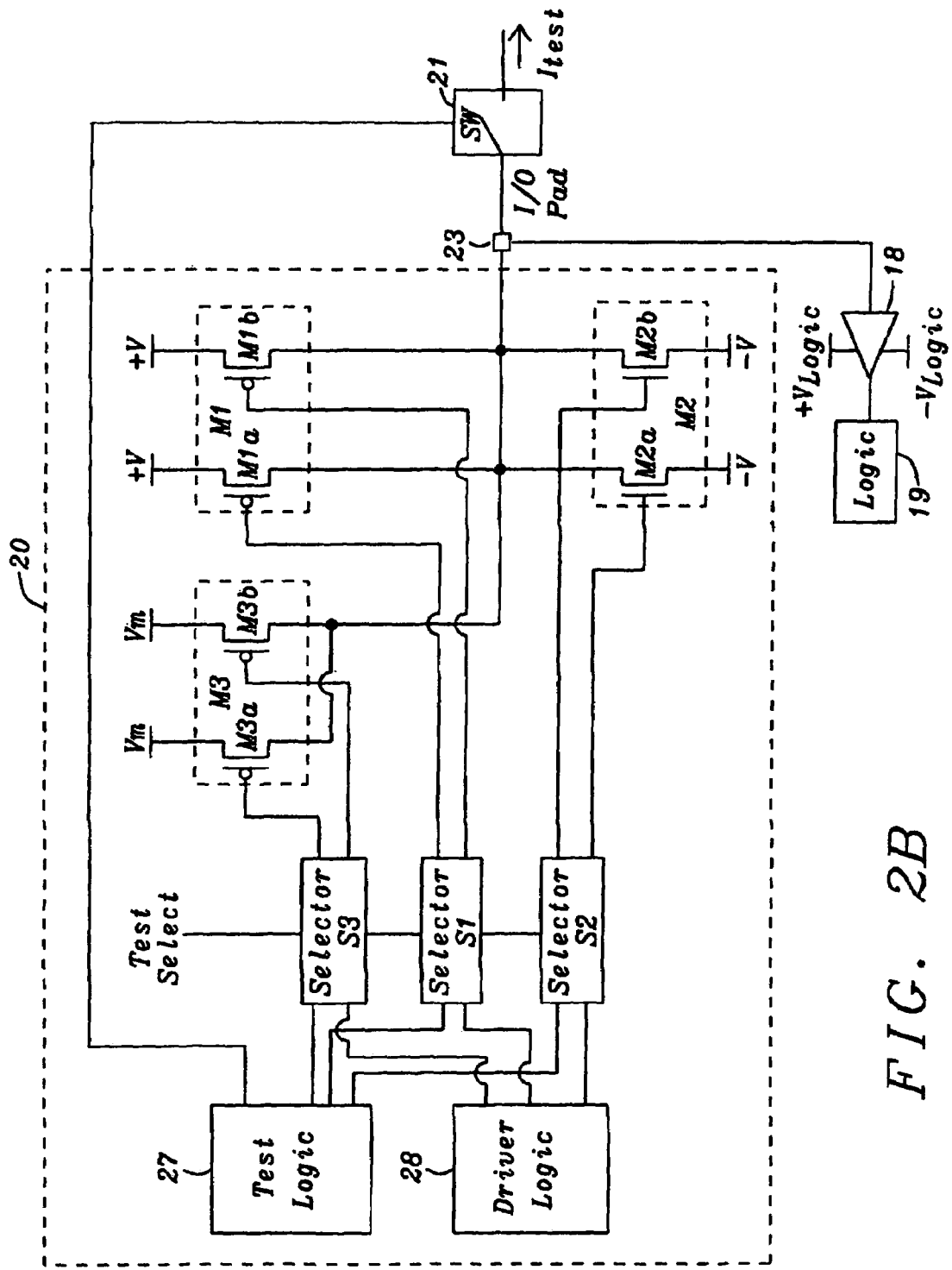
Figure 2C:
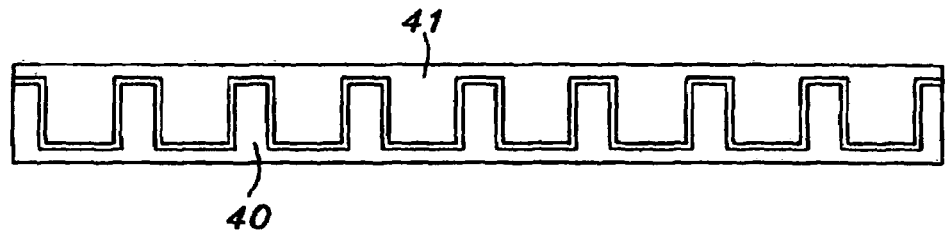
FIGS. 2C and 2D are diagrams of a segmented driver transistor gate of the present invention.
Figure 2D:
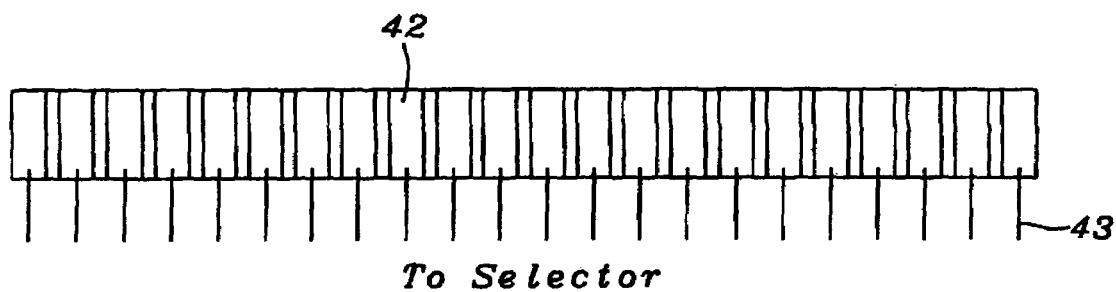

In FIG. 2D is shown a preferred example of a segmented control gate where each finger of the control gate 40 is individually connected 42 to a selector circuit S1 or S2 shown in FIG. 2A. The selector circuit has the capability of configuring the control gate segmentation to accommodate the test requirements of a particular driver test by selecting a single finger (element) or any combination of fingers to create the test transistors M1$b$ and M2$b$. In normal operation of the driver circuit the selector circuits S1, S2 and S3 select all of the fingers to form the control gates of driver transistors M1, M2 and M3.

Continuing to refer to FIG. 2A, the sources of the P-channel transistors M1$a$ and M1$b$ are connected to a +V bias voltage, and the sources of the N-channel transistors M2$a$ and M2$b$ are connected to a −V bias voltage, where in the preferred implementation the voltage −V is circuit ground. The drains of M1$a$ and M1$b$ are connected to the drains of M2$a$ and M2$b$, and further connected to a semiconductor chip I/O pad 23. Connected to the chip I/O pad 23 is a switch circuit 21, which when closed, couples current from the output driver 20 to the test bus 22. The test bus 22 couples $I_{test}$ to a current comparator circuit 24 where the current comparator circuit 24 compares $I_{test}$ to a reference current $I_{ref}$. It should be noted that the direction of the currents $I_{test}$ and $I_{ref}$ are indicated for currents for a positive voltage bias used for driver transistor M1 and would be in opposite direction for a negative voltage bias used for driver transistor M2. The output of current comparator 24 is connected to a scan in port of a test scan register 26 that has a scan out connection to be couple to a tester (not shown). Alternatively, the output of the current comparator circuit 24 can be made accessible to a tester or to built-in self test (BIST) logic.

The control gates of transistors M1$a$ and M1$b$ receive a control gate voltage from selector circuit S1, and in like manner transistors M2$a$ and M2$b$ receive a control gate voltage from selector circuit S2. A test select signal is coupled to selector circuits S1 and S2 to enable the selector circuits S1 and S2 to allow the control gates of M1b and M2b, respectively, to be controlled by the test logic circuit 27, and to disable the control gates of M1a and M2a. A driver logic circuit 28 controls the selectors S1 and S2 to apply the appropriate control gate voltage during normal operation of the output driver 20 to transistors M1 and M2, respectively. During normal operation control gates of M1a and M1b are controlled together to produce an output current from M1 and in like manner control gates of M2a and M2b are controlled together to produce and output current from M2.

The test logic circuit 27 controls the switch 21 closed during test of the output driver circuit 20 allowing current from the output driver circuit to be coupled to the test bus 22. During normal operation of the output driver circuit 20 the test logic circuit opens the switch 21 isolating the test bus 22 from the chip I/O pad 23.

In FIG. 2B is shown an I/O driver circuit 20 that contains an additional P-channel transistor M3 biased to a positive voltage Vm where the segmented gates of transistor M3 are controlled through a selector circuit S3. The control gate of M3 is segmented into two portions to form transistors M3a and M3b similar to that previously discussed with respect to M1 in FIG. 2A. The test logic 27 controls the control gate transistor M3b to produce a drive current $I_{Test}$ that is connected to the test bus 22 when the switch circuit 21 is closed by the test logic 27. Similar to the P-channel transistor M1, the P-channel transistor M3 is biased to a voltage VM and leakage current from M3 is coupled to the test bus 22 for measurement by switch 21. For drive current measurement transistor M3b is controlled to be on, and the transistor drive current $I_{Test}$ is coupled to the test bus 22 by the switch 21.

Figure 2E:
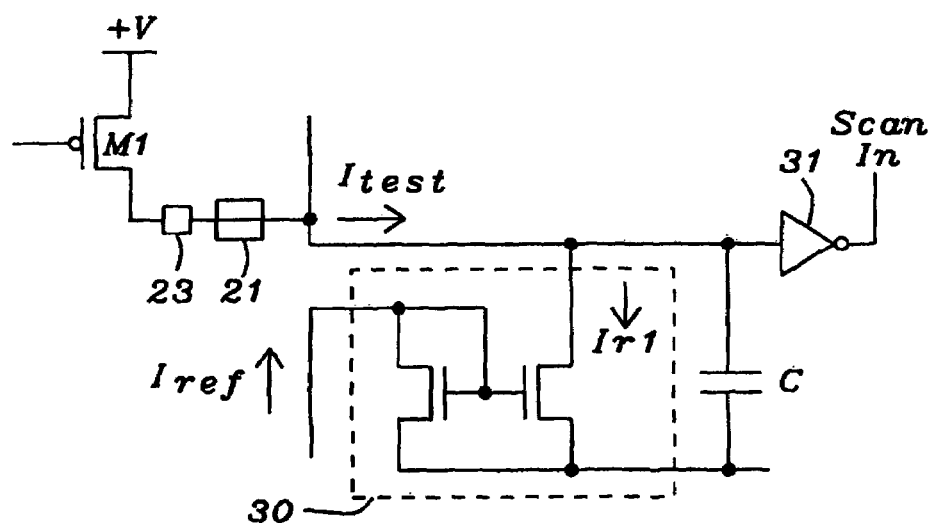
FIGS. 2E and 2F are diagrams of a current comparator of the present invention.

In FIG. 2E is shown a schematic diagram of an implementation of the current comparator circuit 24 comprising a current mirror circuit 30, a capacitance C and an inverter 31. The current mirror circuit 30 is formed with N-channel transistors and produces a current Ir1 that is the mirror of $I_{ref}$. A test current $I_{Test}$ from a P-channel driver transistor M1 (FIG. 2A) is connected to the current comparator circuit through the closed switch 21 and combines with Ir1 to charge capacitance C. The capacitance C can be either a capacitor device or parasitic capacitance of the devices connected to the test bus. When $I_{Test}$ is smaller in magnitude than Ir1, the capacitor C is charged with a negative potential, which is inverted to a positive voltage by the inverter circuit 31 and coupled to the scan in of the test scan register 26. When $I_{Test}$ is larger in magnitude than Ir1, the capacitor is charged to a positive potential and the inverter circuit 31 couples a negative scan in voltage to the test scan register. The inverter circuit 31 is designed with sufficient gain so as control the amount of uncertainty with respect to which current is marginally larger in magnitude to within allowable test margins.

Figure 2F:
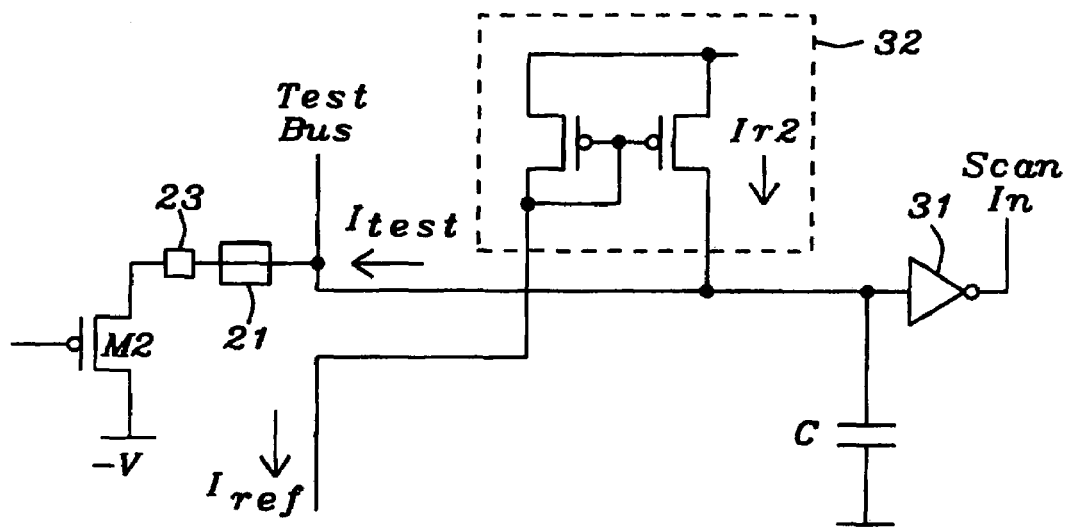

In FIG. 2F is shown a schematic diagram of an implementation of the current comparator circuit 24 comprising a current mirror circuit 32, a capacitance C and an inverter 31. The current mirror circuit 32 is formed with P-channel transistors and produces a current Ir2 that is the mirror of $I_{ref}$. A test current $I_{Test}$ from an N-channel driver transistor M2 (FIG. 2A) is connected to the current comparator circuit through the closed switch 21 and combines with Ir2 to charge capacitance C. The capacitance C can be either a capacitor device or parasitic capacitance of the devices connected to the test bus. When $I_{Test}$ is smaller in magnitude than Ir2, the capacitor C is charged with a positive potential, which is inverted to a negative voltage by the inverter circuit 31 and coupled to the scan in of the test scan register 26. When $I_{Test}$ is larger in magnitude than Ir2, the capacitor is charged to a negative potential and the inverter circuit 31 couples a positive scan in voltage to the test scan register. The inverter circuit 31 is designed with sufficient gain so as control the amount of uncertainty with respect to which current is marginally larger in magnitude near the value of $I_{ref}$ to within allowable test margins.

Figure 3A:
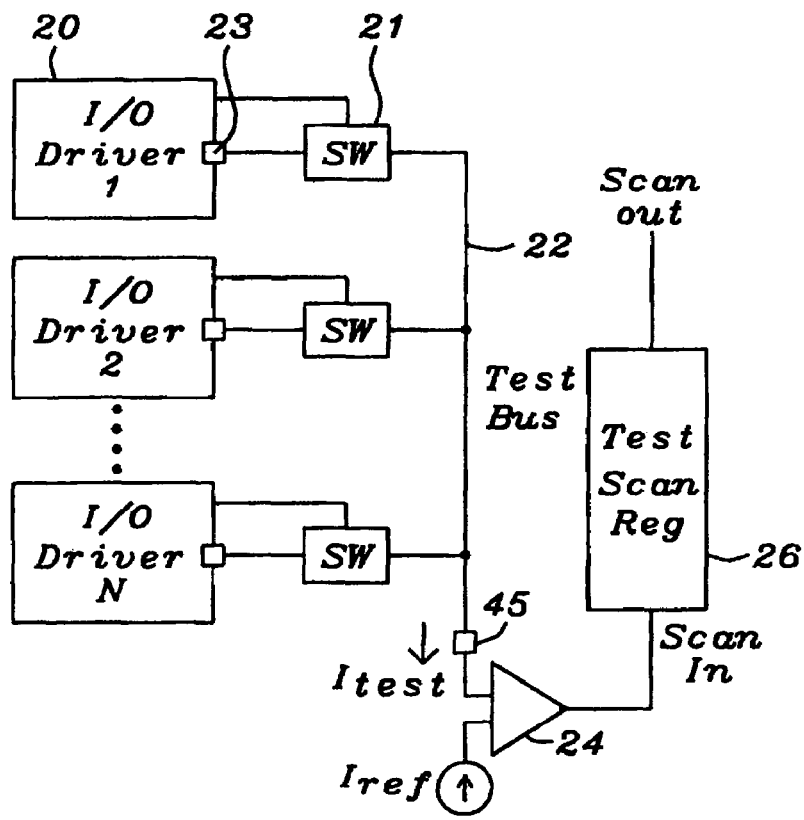
FIG. 3A is a diagram of the present invention showing a plurality of I/O driver circuits connected to a current comparator circuit.

In FIG. 3A is shown a plurality of N I/O driver circuits 20 connected to the test bus 22 by a plurality of switch circuits 21. A test pad 45 is connected to the test bus 22 to allow a tester to measure the current $I_{Test}$. The use of the tester can be in place of the current comparator circuit 24 or as a means to verify the results of the current comparator circuit. In the case of leakage current, the plurality of switches 21 can all be closed simultaneously to measure a composite leakage current from either the P-channel driver transistors M1 or the N-channel driver transistors M2 shown in FIG. 2A and the additional P-channel driver transistor M3 shown in FIG. 4. The composite leakage current measurement, made by either the current comparator 24 or the tester, allows a quick assessment of I/O driver circuit leakage to determine if individual I/O driver circuits 20 require additional leakage current measurement.

Figure 3B:
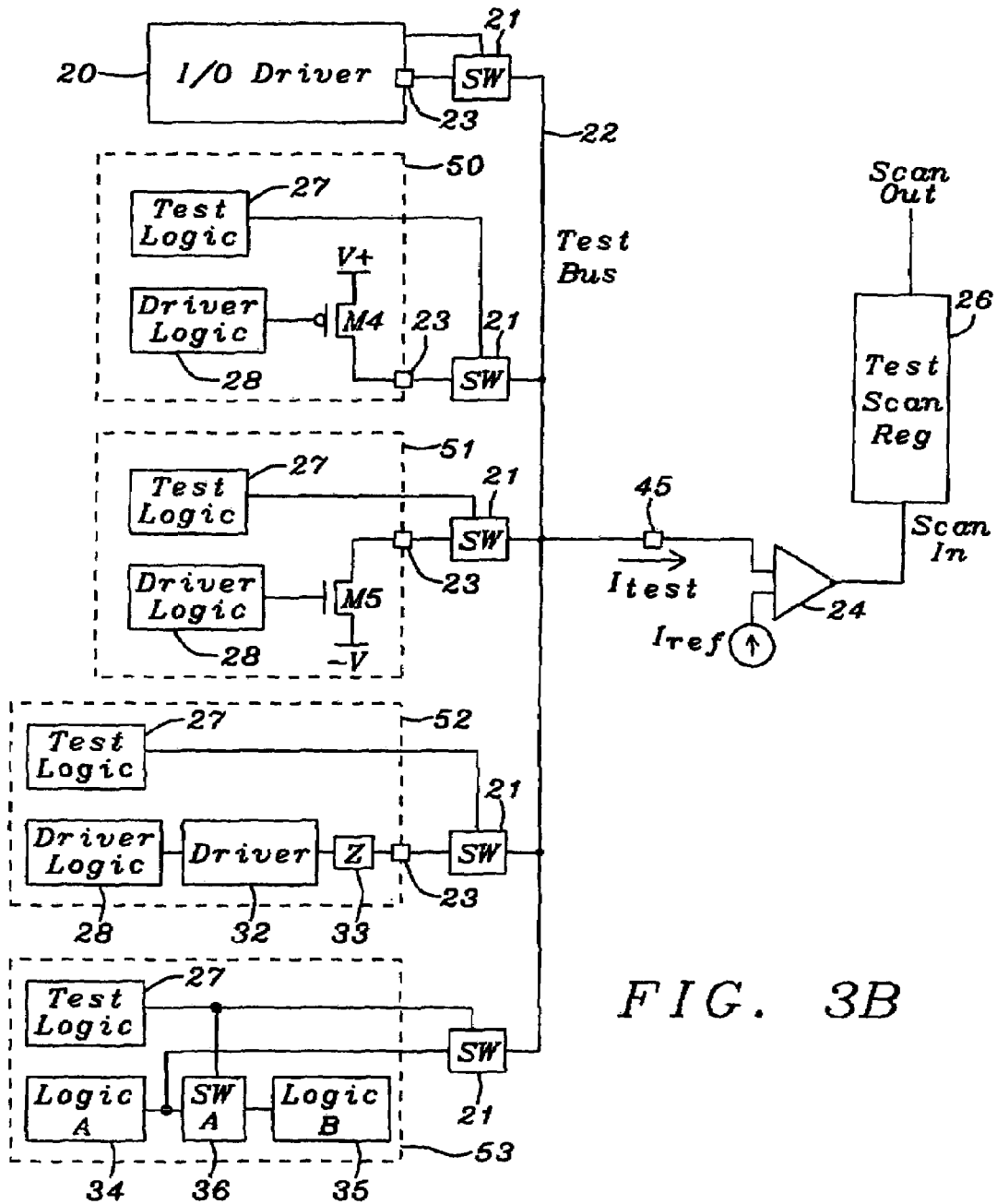
FIG. 3B is a diagram of the present invention showing a variety of circuitry connected to a current comparator circuit.

In FIG. 3B is an example of a variety of circuitry 20, 50, 51, 52 and 53 that is coupled to a current comparator 24. The circuits shown in FIG. 3B are coupled to a current comparator circuit 24 through a switch circuit 21. Depending upon design requirements, the circuits 20, 50, 51, 52 and 53 may be located on the same integrated circuit chip, or on separate integrated circuits chips where each separate chip contains a current comparator circuit 24. As described with respect to FIG. 2A and FIG. 2B, the I/O driver circuit 20 is coupled to a switch circuit 21 that is connected to the chip I/O pad 23 to which the I/O driver circuit is connected. The switch 21 is controlled by a test logic circuit 27 to close the switch, which allows a test current $I_{Test}$ from the I/O driver to be connected to the test bus 22. The test current $I_{Test}$ can be leakage current or an on current from circuitry within the I/O driver circuit. The current comparator circuit 24 compares $I_{Test}$ to a reference current $I_{ref}$ and couples the compare results to a test scan register 26 or other readout mechanisms such as a tester and BIST logic. A test pad 45 allows a tester to couple to the test bus 22 to allow a tester to make test measurements.

Continuing to refer to FIG. 3B, in circuit 50 an open drain P-channel transistor device M4 is connected to a chip I/O pad 23. A switch 21 controlled by the test logic 27 is connected to the chip I/O pad to couple a test current $I_{Test}$ from M4 to the test comparator circuit 24. The driver logic 28 controls the transistor device M4 in an off state to produce a leakage current to be coupled to the current comparator 24 and controls M4 to be in an on state to produce an on current to be coupled to the current comparator. The reference current $I_{ref}$ is set to a value of current necessary to measure leakage current and then set to a value of current necessary to measure on current of M4.

Continuing to refer to FIG. 3B, in circuit 51 an open drain N-channel transistor device M5 is connected to a chip I/O pad 23. A switch 21 controlled by the test logic 27 is connected to the chip I/O pad to couple a test current $I_{Test}$ from M5 to the test comparator circuit 24. The driver logic 28 controls the transistor device M5 in an off state to produce a leakage current to be coupled to the current comparator 24 and controls M5 to be in an on state to produce an on current to be coupled to the current comparator. The reference current $I_{ref}$ is set to a value of current necessary to measure leakage current and then set to a value of current necessary to measure on current of M4. The direction of $I_{Test}$ and $I_{ref}$ shown in FIG. 3B is symbolic and will be in a reverse direction for a negative source voltage as is the case with M5.

Continuing to refer to FIG. 3B, an impedance 33 is located between a driver circuit 32 and the chip I/O pad 23 to which is connected switch 21. The driver circuit 32 may comprise transistor devices M4, M5 and the driver circuits of FIG. 2A and FIG. 2B. The impedance 33 can be a resistance, an inductance or some combination of resistance and inductance and including a capacitance.

Continuing to refer to FIG. 3B, the current measuring technique describe herein is applied to an internal circuit 53, wherein an output current of logic A 34 is connected to an input to logic B 35. A switch "A" 36 under the control of the test logic 30 is opened to allow current from logic "A" 34 to be diverted to switch 21 and coupled to the test bus 22 when switch 21 is closed. The current from the output of logic "A" 34 is then compared to $I_{ref}$ in the current comparator circuit 24 and the results of the current comparison is coupled to the test scan register 26.

It should be noted that current from circuitry containing bipolar transistors and other devices not specifically described herein can be measured in the same or similar fashion as described herein with respect to CMOS devices and circuits. It should be also noted that the current measurement techniques noted herein are applicable to all semiconductor devices with or without a segmented control function similar to that described in FIGS. 2A, 2B, 2C and 2D.

The semiconductor switch 21 shown in FIGS. 2A and 2B must be of comparable size to the largest driver segmented test transistor M1b and M2b in order to connect the test current $I_{test}$ to the test bus 22 without restricting the current. For each I/O that have the high current drivers this requires two relatively large additional transistors, which takes up valuable chip real estate to accommodate driver on-state current measurements.

Figure 4A:
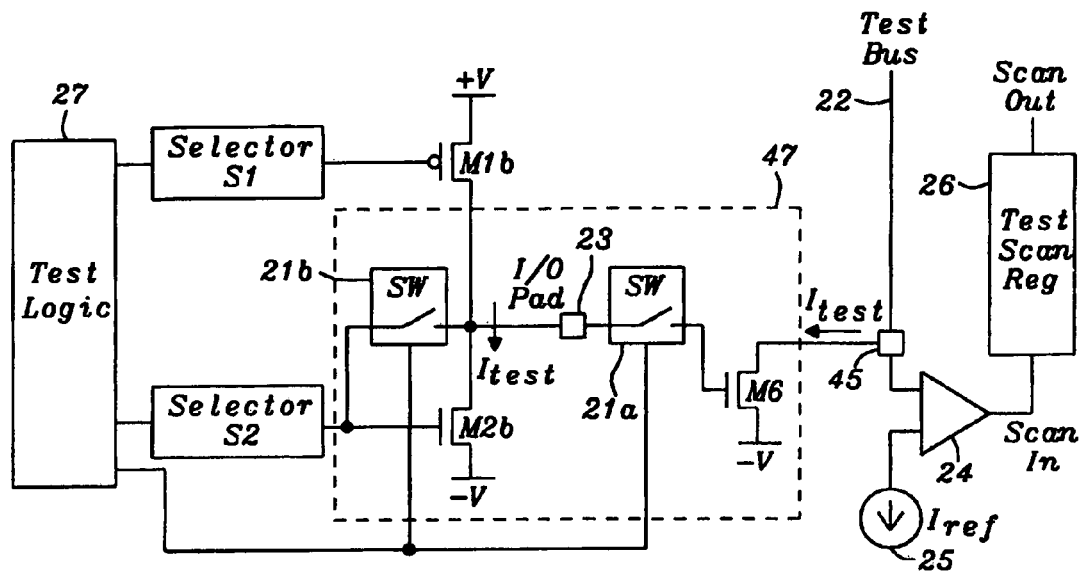
FIGS. 4A and 4B are diagrams of the preferred embodiment of the present invention of a current mirror circuit to couple driver transistor current to a current comparator circuit.
Figure 4B:
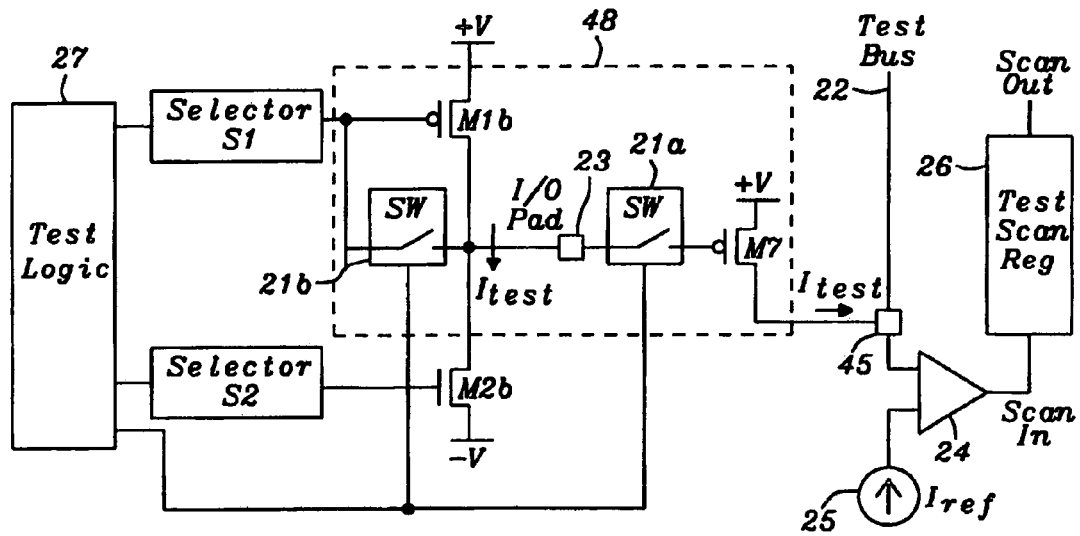

In FIGS. 4A and 4B is shown a preferred embodiment of the present invention for measuring driver current in which the switch 21a connecting driver current to the test bus 22 is implemented with a small, low current device. In FIG. 4A the P-channel segmented transistor M1b is selected by the selector circuit S1 to be measured for on-state current and is biased with a +V bias. The N-channel segmented transistor M2b is configured by the selector circuit S2 to be the input transistor to a current mirror circuit 47. The test logic 27 closes switch 21b to produce a drain voltage, which when coupled to the gate of the N-channel transistor M6, produces a current $I_{test}$ that is proportional to the current flowing in the segmented transistor M1b and subsequently through the segmented transistor M2b as a result of the mirror ratio between transistors M6 and M2b. The switch device 21a, which is closed by the test logic to couple the current mirror signal to the current mirror output transistor M6, is a minimal size device since little to no current is being carried by the switch device 21a. Transistor device M6 must be of same length as M2b, but the width of M6 can be chosen much smaller to reproduce a test current $I_{test}$ of sufficient magnitude to provide an accurate current measurement. The drain, or output, of M6 is connected to the test bus 22, which couples $I_{test}$ to the comparator circuit 24

Figure 4C:
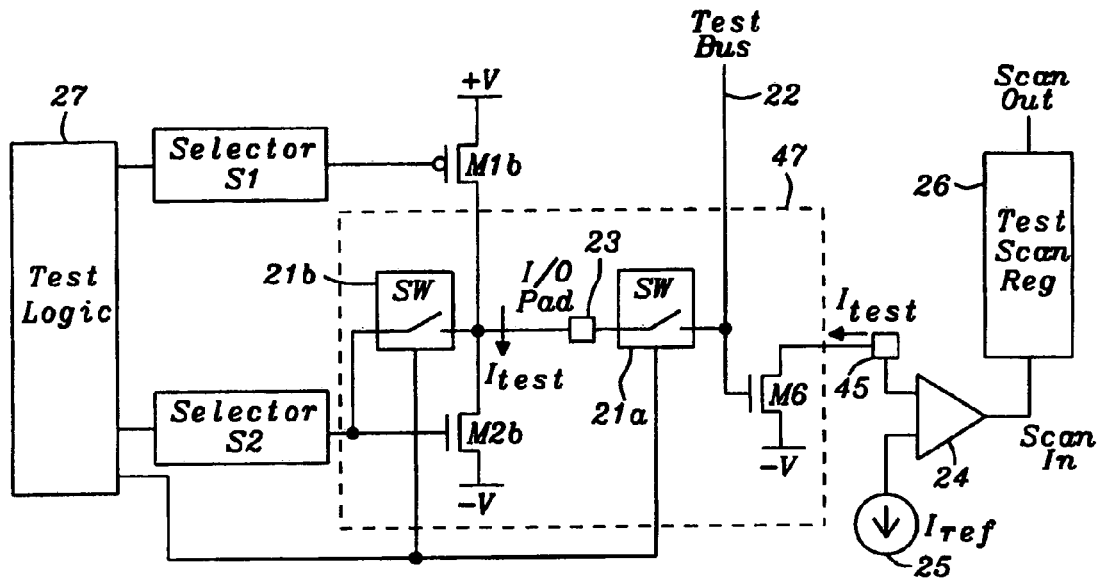
FIGS. 4C and 4D are diagrams of an alternate implementation to the preferred embodiment of the present invention of a current mirror circuit that couples driver transistor current to a current comparator circuit
Figure 4D:
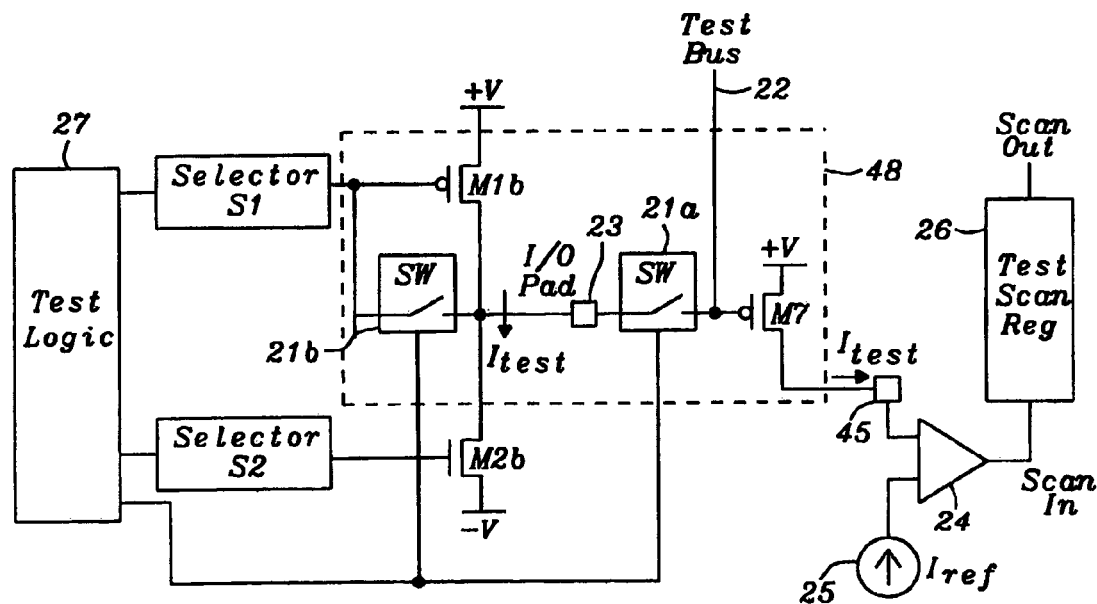

In FIG. 4B the N-channel segmented transistor M2b is selected by the selector circuit S2 to be measured for on-state current and is biased with a −V bias. The P-channel segmented transistor M1b is configured by the selector circuit S1 to be the input transistor to a current mirror circuit 48. The test logic 27 closes switch 21b to produce a drain voltage, which when coupled to the gate of the P-channel transistor M7, produces a current $I_{test}$ that is proportional to the current flowing in the segmented transistor M2b and subsequently through the segmented transistor M1b as a result of the mirror ratio between M7 and M1b. The switch device 21a, which is closed by the test logic to couple the current mirror signal to the current mirror output transistor M7, is a minimal size device since little to no current is being carried by the switch device 21a. Transistor device M7 must be of same length as M1b but the width of M7 can be chosen to be much smaller to produce a useful test current $I_{test}$ of sufficient magnitude to provide an accurate current measurement. The drain, or output, of M7 is connected to the test bus 22, which couples $I_{test}$ to the comparator circuit 24. In FIGS. 4C and 4D is shown an alternative of the preferred embodiment of the present invention for measuring driver current in which the gates of the mirror transistors M6 and M7 are connected to the test bus 22. Thus, only one mirror transistor M6 and one mirror transistor M7 is required for coupling test current to the current comparator circuit 24 from all of the P-channel and N-channel test transistors M1b and M2b connected to the test bus, In FIG. 4C the P-channel segmented transistor M1b is selected by the selector circuit S1 to be measured for on-state current and is biased with a +V bias. The N-channel segmented transistor M2b is configured by the selector circuit S2 to be the input transistor to a current mirror circuit 47. The test logic 27 closes switch 21b to produce a drain voltage, which when coupled to the gate of the N-channel transistor M6, produces a current $I_{test}$ that is proportional to the current flowing in the segmented transistor M1b and subsequently through the segmented transistor M2b as a result of the mirror ratio between transistors M6 and M2b. The switch device 21a, which is closed by the test logic to couple the current mirror signal to the current mirror output transistor M6, is a minimal size device since little to no current is being carried by the switch device 21a. Transistor device M6 must be of a same length as M2b but its width can be chosen much smaller to reproduce a useful test current $I_{test}$. It should be noted, that by connecting the test bus 22 to the gate of transistor device M6, only one M6 transistor device is required to accommodate current measurement of all P-channel driver transistors coupled to the test bus 22.

In FIG. 4B the N-channel segmented transistor M2b is selected by the selector circuit S2 to be measured for on-state current and is biased with a −V bias. The P-channel segmented transistor M1b is configured by the selector circuit S1 to be the input transistor to a current mirror circuit 48. The test logic 27 closes switch 21b to produce a drain voltage, which when coupled to the gate of the P-channel transistor M7, produces a current $I_{test}$ that is proportional to the current flowing in the segmented transistor M2b and subsequently through the segmented transistor M1b as a result of the mirror ratio between M7 and M1b. The switch device 21a, which is closed by the test logic to couple the current mirror signal to the current mirror output transistor M7, is a minimal size device since little to no current is being carried by the switch device 21a. Transistor device M7 must be of same length as M1b but the width can be chosen to be much smaller to reproduce a useful test current $I_{test}$. It should be noted that by connecting the test buss 22 to the gate of transistor device M7, only one M7 transistor device is required to accommodate current measurement of all N-channel driver transistors coupled to the test bus 22.

Figure 4E:
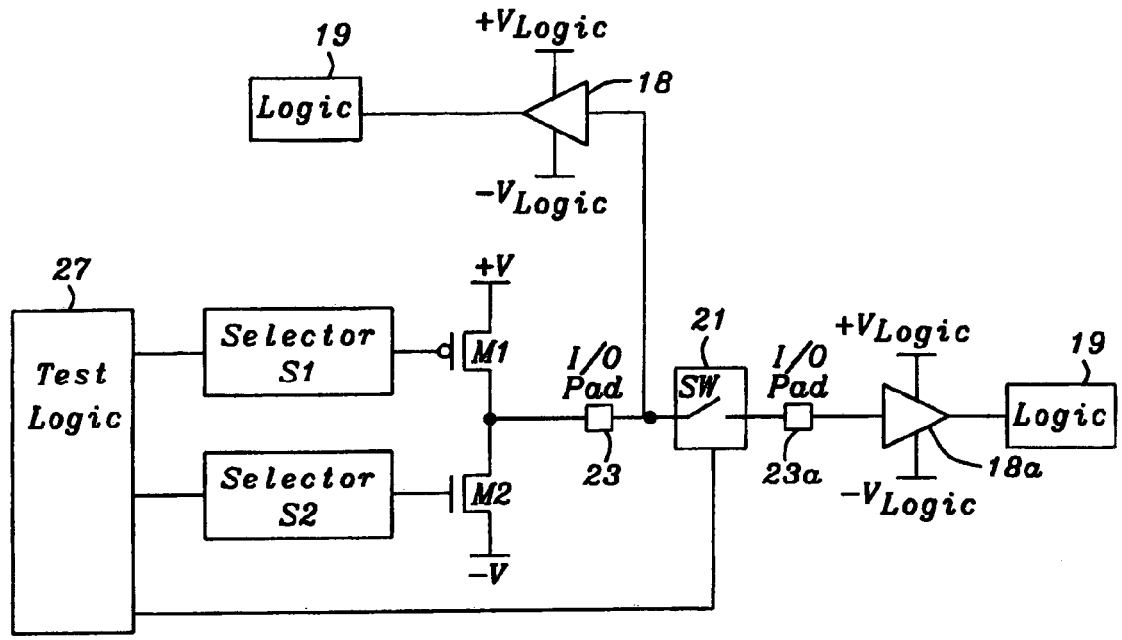
FIG. 4E is a diagram of a test configuration of the present invention for I/O input circuits.

In FIG. 4E is a configuration for testing an input circuit 18 connected to the same chip I/O pad 23 as a driver circuit and connected to an I/O pad 23a not connected to a driver circuit. A driver circuit comprising transistor devices M1 and M2 and biased to voltages +V and −V is connected to a chip I/O pad 23. An I/O input circuit 18 biased to +$V_{Logic}$ and −$V_{Logic}$ is coupled to the same I/O pad 23 as the driver circuit. The output of the I/O input circuit 18 is couples input signals to chip logic 19. In a similar fashion a second I/O input circuit 18a coupled to a second I/O pad 23a is connected to the driver circuit containing transistor devices M1 and M2 through a switch 21.

Figure 4F:
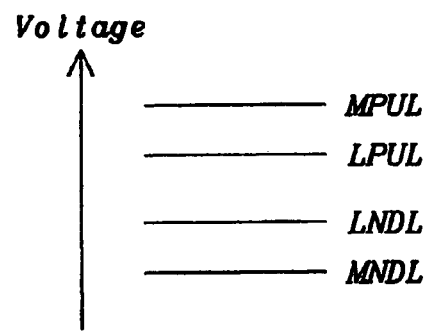
FIG. 4F is a voltage level diagram of the present invention for I/O input circuits.

FIG. 4F demonstrates input and output signal voltage levels. An operating voltage range for an up level signal is between a most positive up level (MPUL) and a least positive up level (LPUL). The operating voltage range for a down level signal is between a most negative down level (MNDL) and a least negative down level (LNDL).

Continuing to refer to FIG. 4E, the bias voltage for driver transistor M1 is set to a voltage equal the LPUL of an input signal that can be coupled the input circuit 18, and the selector circuit S1 selects transistor device M1 to connect the LPUL voltage to the input circuit 18. The logic 19 is polled to determine if the input circuit 18 was able to detect the LPUL voltage. The switch 21 is activated by the test logic 27 to couple the LPUL voltage to the second input circuit 18a connected to a second I/O pad 23a, and the logic 19 is polled to determine if the second input circuit 18a was able to detect the LPUL voltage. In a like fashion the bias voltage for driver transistor M2 is set to a LNDL voltage of the I/O input circuits 18 and 18a. The driver transistor M2 is selected by the selector circuit S2 and the logic 19 is polled to determine if the I/O input circuit 18 and 18a were able to detect the LNDL voltage.

Figure 5A:
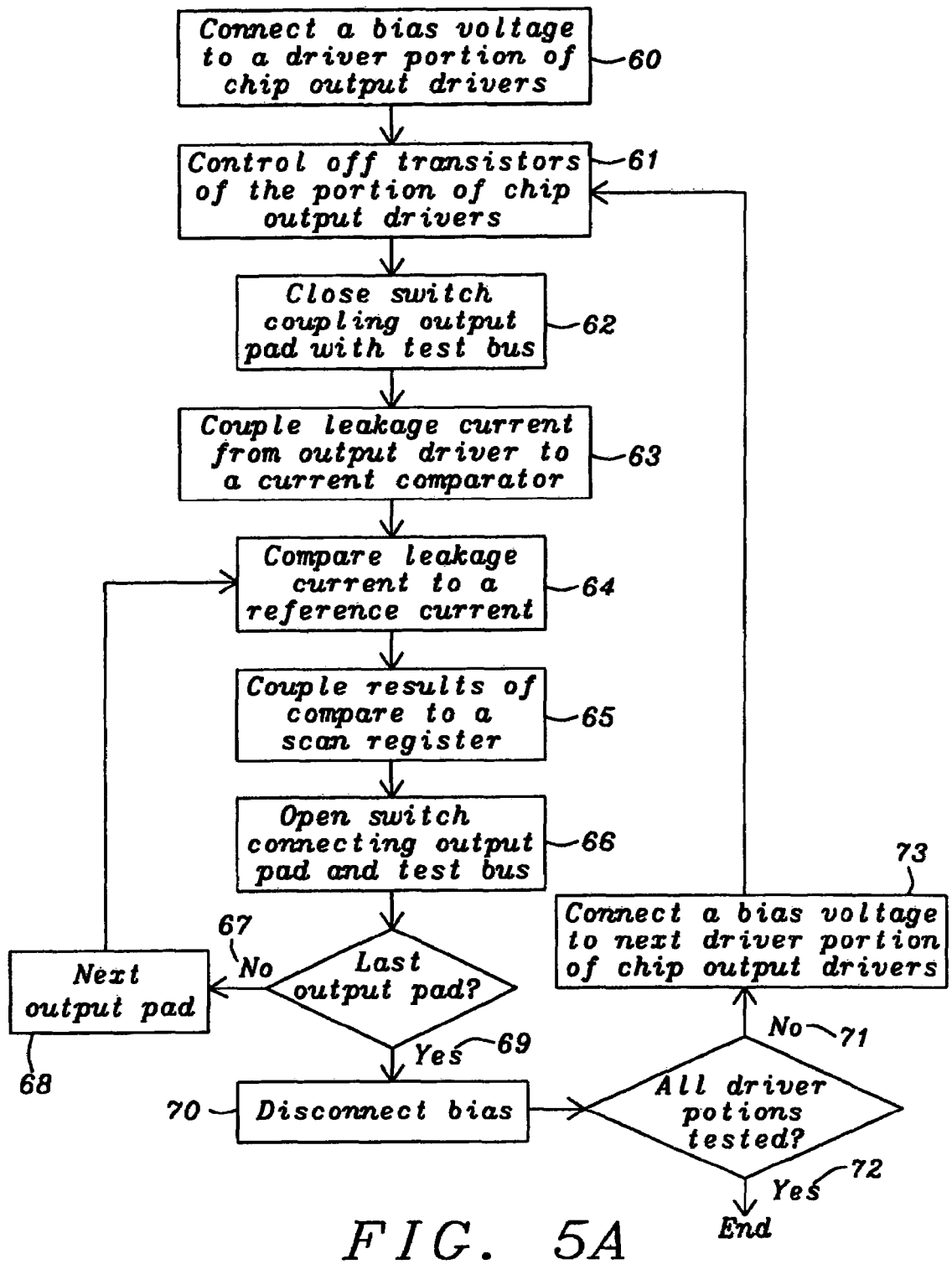
FIGS. 5A and 5B are flow diagrams of the present for the method of testing leakage current of the I/O driver transistors.

In FIG. 5A is a flow diagram of the present invention showing a method of testing leakage current of I/O driver transistors where a particular driver circuit transistor portion, either P-channel transistor M1 or M3 or N-channel transistor M2, is powered on for all the output driver circuits of a chip 60, controlling the transistor portion of the output driver circuits 20 (FIG. 2 and FIG. 4) to be off 61, and then closing the switch 21 coupling an output pad to the test bus 62. Coupling leakage current from the output driver circuit to a current comparator circuit 63. Compare the leakage current to a reference current 64, and couple the current comparator circuit results to a test scan register 65. If the output pad connected to an I/O driver circuit is not the last output pad 67 connected to an I/O driver circuit, then proceed to the next output pad 68, close the switch connecting the next output pad to the test buss 63, couple the leakage current from the next output pad to the current comparator 63, compare the leakage current of the next output pad to a reference current 64, couple the compare results of the leakage current from the next output pad to a test scan register 66. Open the switch connecting the next output pad to the test bus 66 and continuing until leakage current for the particular driver transistor connected to all output pads have been tested.

Continuing to refer to FIG. 5A, if the last pad has been tested 69, disconnect bias from the particular transistor portion of the output driver circuit 70, and if all output driver circuit transistor portions have been tested 72, then end the leakage testing. If all output transistor portions (M1, M2 or M3) of the output driver circuit have not been tested for leakage current 71, then connect a bias voltage to the next output transistor portion of the I/O drivers on the semiconductor chip 73. Control off the next output transistor portion 61, close the switch the output pad to the test bus 62, couple leakage from the next output transistor portion connected to the output pad to the current comparator circuit 63, compare the leakage current to a reference current 64, couple results of the current comparator circuit to a test scan register 65 and open the switch connecting the output pad to the test bus 66. Continuing in like fashion until all output pads for all driver circuit transistor portions have been tested for leakage current.

Figure 5B:
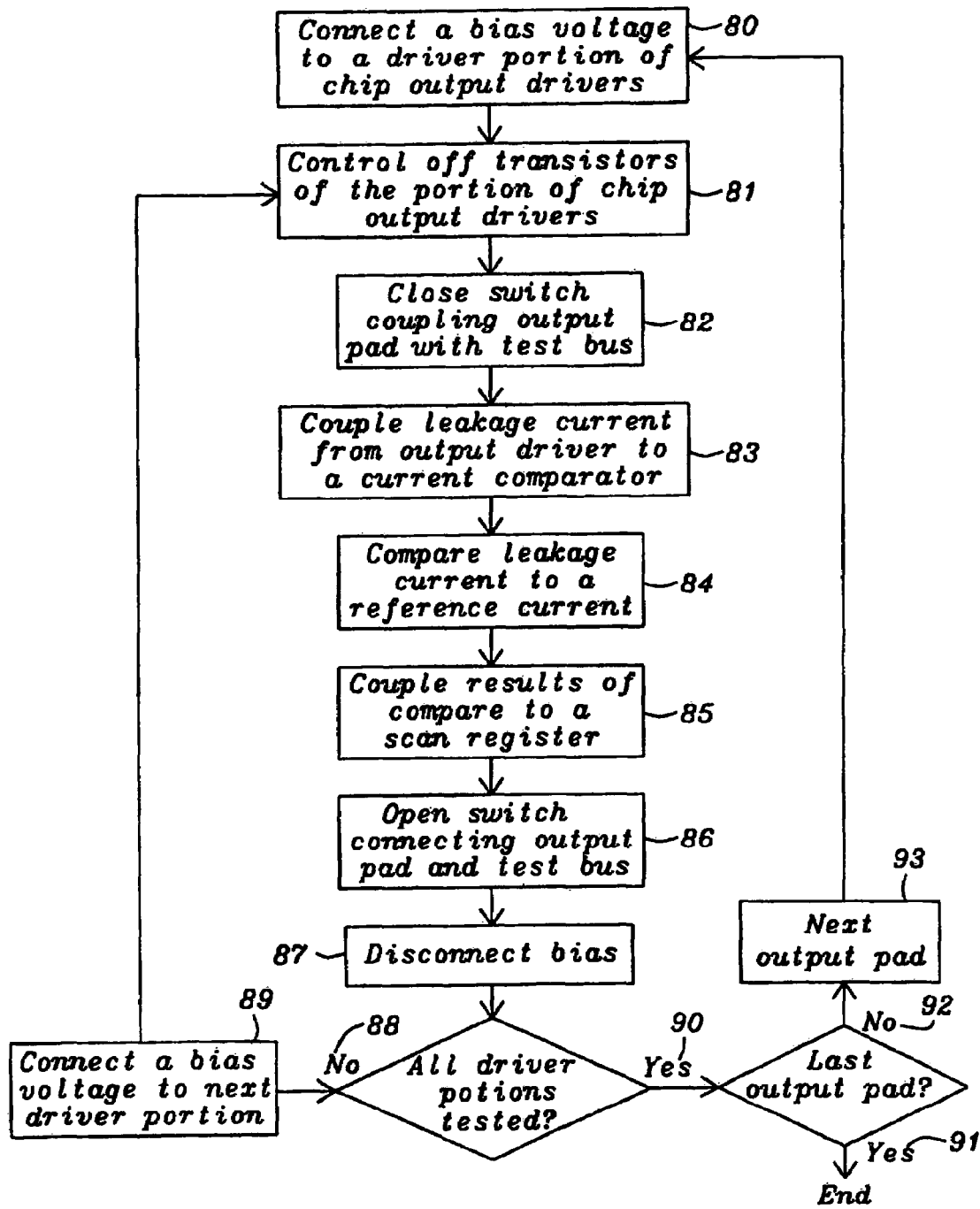

In FIG. 5B is a flow diagram of the present invention where all I/O driver portions, transistors M1, M2 and M3, connected to a particular chip I/O pad are tested for leakage current before going to a next chip I/O pad and performing leakage testing on the driver portions, transistors M1, M2 and M3, connected to the next I/O pad. A bias voltage is connected to a driver portion 80, for example +V connected to transistor portion M1 in FIG. 2. The transistor portion is controlled to an off state 81 and the switch coupling between the chip I/O pad and the test bus is closed 82. Leakage current is coupled from the driver connected to the I/O pad to a current comparator circuit connected to the test bus 83 where the current comparator compares the leakage current to a reference current 84. The results of the current comparator is coupled to a test scan register 85, the switch connected to the I/O pad is opened 86 and the bias connected to the transistor portion is disconnected 87.

Continuing to refer to FIG. 5B, if all driver portions connect to the I/O pad have not been tested for leakage current 88, a bias voltage is connected to the next driver portion 89. The next driver transistor portion is controlled in an off state 81 and the switch is connecting the chip I/O pad to the test bus is closed 82. Leakage from the next driver portion is coupled from the driver circuit to the current comparator 83, and the leakage current is compared to a reference current in the current comparator circuit 84. The results of the comparator circuit is coupled to a test scan register 85, the switch is opened 86, and the bias to the next driver portion is disconnected 87.

Continuing to refer to FIG. 5B, if all driver portions, comprising transistors M1, M2 and M3, connected to the I/O chip pad have been tested for leakage current 90 and the driver circuit connected to the last output pad has been tested for leakage current 91, then end the leakage testing. If the driver circuit connected to the next I/O pad has not been tested for leakage current 92, then go to the next I/O pad connected to a driver circuit 93 and connect a bias voltage to a driver portion 80, comprising transistors M1, M2 or M3, and control the selected driver portion connected to the next I/O pad in an off state 81. Close the switch connected between the next I/O pad and the test bus 82 and couple leakage current from the driver circuit to the current comparator circuit 83. Compare the leakage current from the next I/O pad to a reference current 84 coupling the results of the compare to the test scan register 85, opening the switch 86 and disconnecting the bias 87 to the driver portion. Continuing to test leakage current from the driver circuit portions until all driver portions connected to all I/O pads have been tested.

Figure 6A:
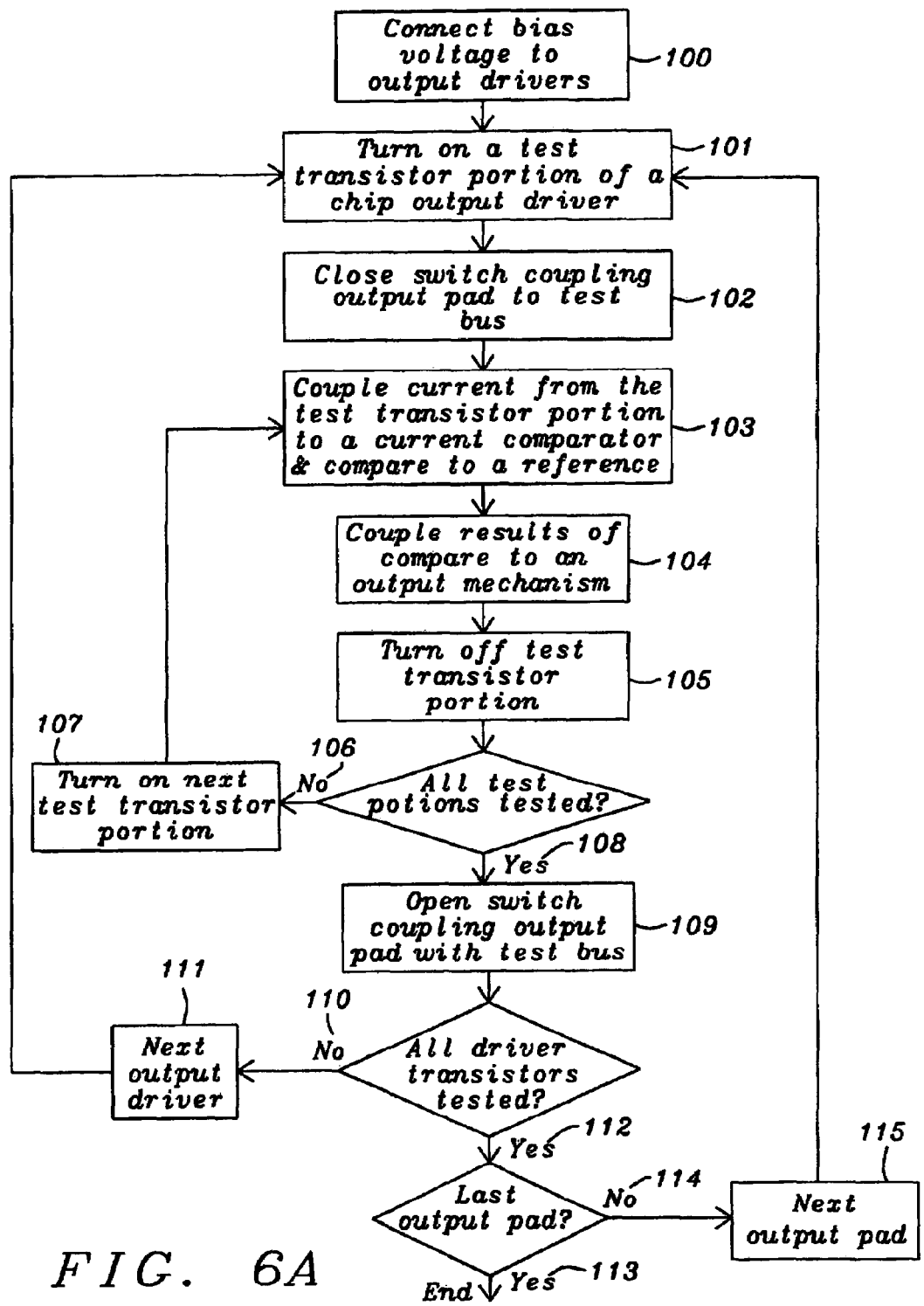
FIGS. 6A and 6B are flow diagrams of the present invention for the method of testing the test transistor segments of the I/O driver transistors.

In FIG. 6A is a flow diagram of a method to test the drive current capability of the portions of an I/O driver circuit comprising transistors M1, M2 and M3. The transistors M1, M2 and M3 have a segmented gate, which forms a test transistor M1b, M2b and M3b. FIG. 2D shows an example of the preferred configuration of a segmented gate where each segmented element 42 can be selected individually by the selector circuit S1, S2 and S3 to form a test transistor portion M1b, M2b and M3b of the driver transistors M1, M2, and M3 respectively. Any combination of a plurality of segmented gate elements 42 can be configured by the selector S1, S2, and S3 to form the test transistor portion M1b, M2b and M3b, depending on test requirements. Since the driver control gates are segmented to facilitate the testing of the driver, a driver transistor will not be completely tested until all segmented elements 42 or any combination thereof are configured as test transistor portions M1b, M2b, and M3b and coupled to the current comparator circuit 24.

The test transistors M1b, M2b and M3b are used to test the driver transistors M1, M2 and M3 respectively, at an appropriate current to test the integrity of the driver transistors M1, M2 and M3 area. The bias voltages, +V, −V and +Vm are connected to the driver transistors M1, M2 and M3, respectively 100. A test transistor of a driver transistor connected to a chip I/O pad is turned on 101 by the test logic, which closes the switch coupling the I/O pad to the test bus 102. Current from the test transistor portion of the driver transistor is coupled to a current comparator circuit, and the current is compared to a reference current connected to the current comparator 103. The results of the comparator circuit is coupled to an output mechanism 104 comprising readout devices such as a scan register, a BIST and a test pad that is contacted by a tester. The test transistor portion of the drive transistor is turned off 105, and if all test transistor portions of a driver transistor have not been tested 106, then the next test transistor portion is turned on 107, test current is coupled from the next test transistor portion to the current comparator circuit 103, and the process is continued.

If all test transistor portions of the driver transistor have been tested, then the switch coupling the test pad to the test bus is opened 109. If all driver transistors connected to an I/O pad have not been tested 110, the next output driver transistor is selected 111, a test transistor portion of the next output driver transistor is turned on 101 and the process continues. If all driver transistors connected to the I/O pad have been tested 112 and the last I/O pad has been tested for driver current 113, then end the test process. If the last I/O pad has not been tested for driver current 114, the next I/O pad is selected 115, a test transistor portion of the next I/O pad is turned on 101, and the process is continued.

Figure 6B:
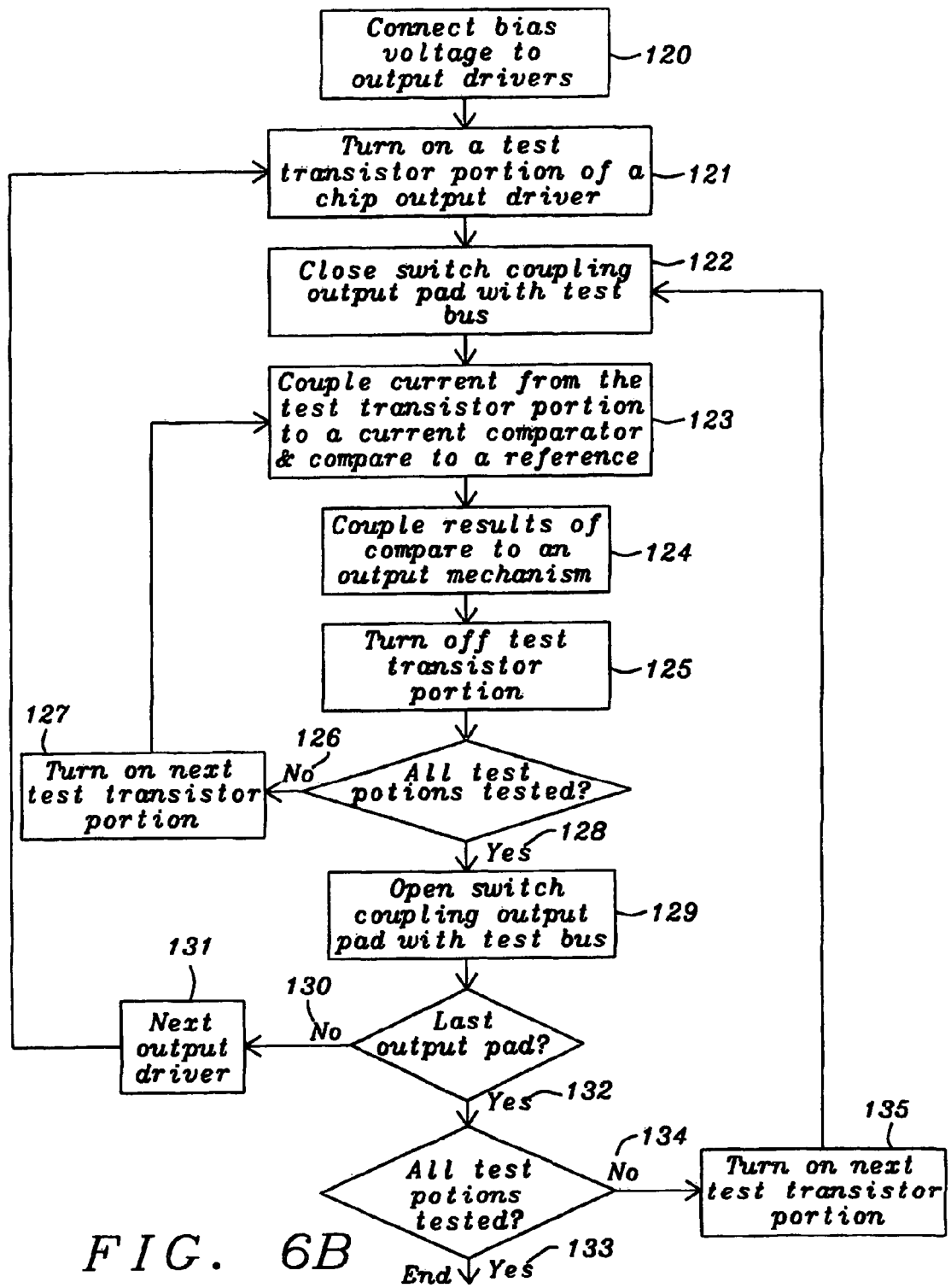

In FIG. 6B is a method of the present invention for testing the current from a particular test transistor portion (M1b, M2b or M3b) of an I/O driver transistor (M1, M2, or M3) first at all chip I/O pads containing the particular I/O driver transistor before continuing to the test transistor portion of the next I/O driver transistor. A bias voltage is connected to each of the I/O driver transistors on a semiconductor chip 120. A +V bias voltage is connected to the P-channel transistor M1 comprising transistor portions M1a and M1b, a −V bias voltage is connected to the N-channel transistor M2 comprising transistor portions M2a and M2b and a +Vm bias voltage is connected to the P-channel transistor M3 comprising transistor portions M3a and M3b. A test transistor portion (M1b, M2b or M3b) is turned on 121 by control from the test logic 27, and the switch coupling the chip I/O pad to the test bus is closed 122. The current from the selected test transistor portion is coupled to a current comparator circuit and the current is compared to a reference current by the comparator circuit 123. The output of the comparator circuit is connected to an output mechanism 124 such as a test scan register, a BIST or a test pad to be contacted by tester. The selected test transistor portion of an I/O driver transistor is turned off 125 and if all test transistor portions of the selected driver transistor have been tested 128, then the switch connecting the Chip I/O pad to the test bus is opened 129. If all test transistor portions of the selected driver transistor have not been tested, then the next test transistor portion is turned on 127, current is coupled from the next test transistor portion to the current comparator circuit 123, and the process continues.

Continuing to refer to FIG. 6B, if the test transistor portions of last chip I/O pad has not been tested 130, then go to the next chip I/O pad 131 and turn on the test transistor portion connected to the chip I/O pad 121. Close the switch connecting the next chip I/O pad to the test bus 122, and continue the process. Continuing to refer to FIG. 6B, if the test transistor portion connected to the last chip I/O pad has been tested 132 and if all test transistor portions have been tested 133, then end. If all test transistor portions have not been tested 134 then turn on the next test transistor portion 135 connected to a chip I/O pad, and close the switch connecting the chip I/O pad to the test bus 122. Couple the on current from the next test transistor portion to the current comparator circuit, and compare the current of the next test transistor portion to a reference current 123, continue the process until all test transistor portions, comprising M1b, M2b and M3b, connected to all Chip I/O pads have been tested for drive current capability.

Figure 7:
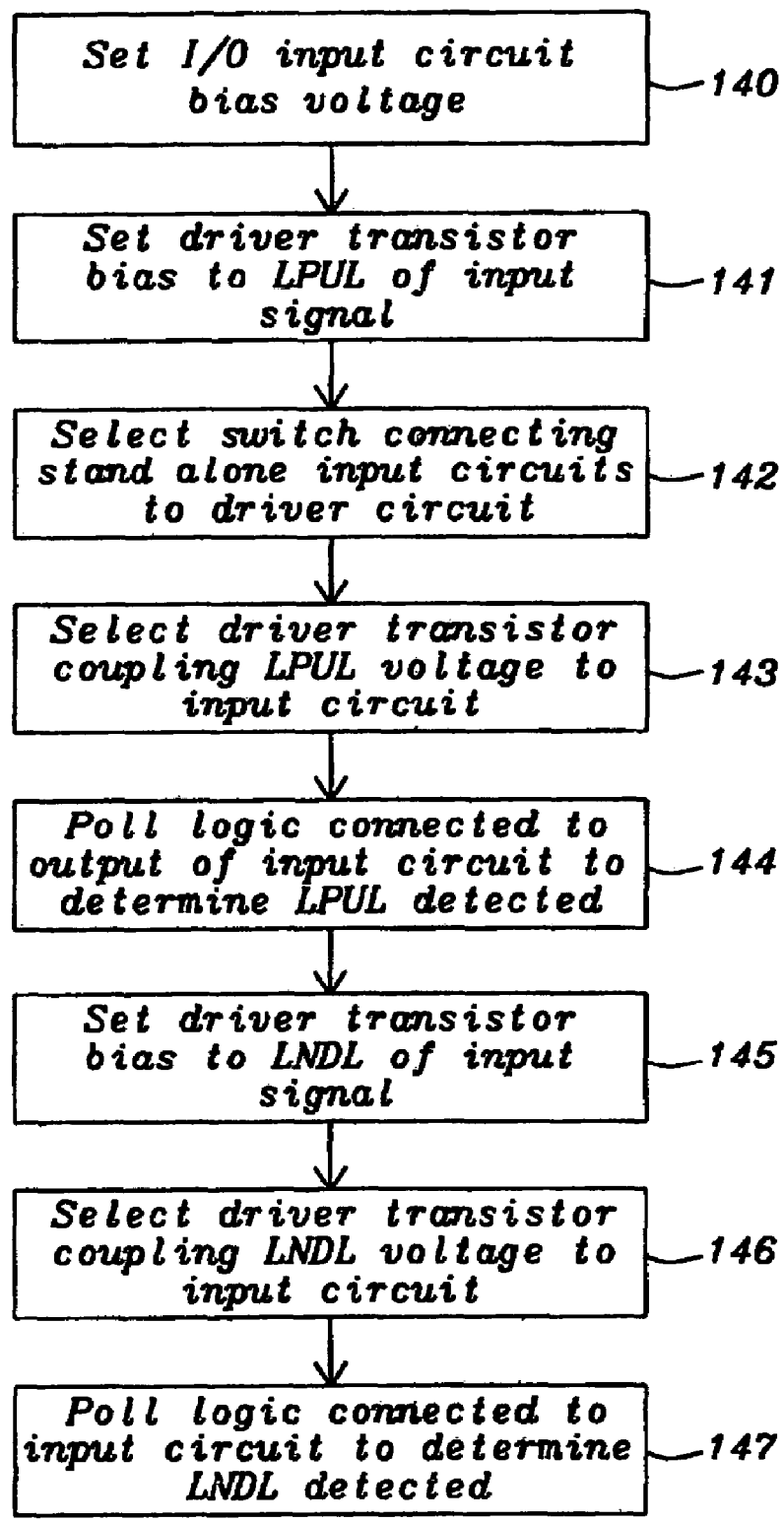
FIG. 7 is a flow diagram of the present invention to test input circuits by coupling marginal voltage levels to input circuits from output driver circuits.

Referring to the circuit diagram of FIG. 4E, a method of the present invention to measure the capability of an I/O input circuit 18 and 18a to detect an input voltage is shown in FIG. 7. The bias (+$V_{Logic}$ and −$V_{Logic}$) for the I/O input circuits is set to a specified test value 140. In the preferred embodiment of the present invention the logic bias −$V_{Logic}$ and the bias −V for the N-channel driver transistor are logic ground; however, the method of FIG. 7 will function equally well if −$V_{Logic}$ and −V have a voltage value that is negative with respect to circuit ground. A driver circuit bias is set to a voltage that equals the LPUL voltage of the input circuit 141, and a switch 21 is selected by the test logic, which connects a stand-alone I/O input circuit 18a to the driver circuit 142. A driver transistor is selected to couple the LPUL voltage 143 to the input circuit 18 connected to the I/O pad 23 and the stand-alone input circuit 18a. The logic circuits 19 connected to the outputs of the input circuits 18 and 18a are polled to determine that the input circuits detected the LPUL voltage 144. The driver circuit bias is set to a LNDL voltage of the input circuits 145. The driver circuit is selected to couple the LNDL voltage to the input circuits 146, and the logic circuits 19 connected to the output of the input circuits are polled to determine that the input circuits detected the LNDL voltage 147.

While the invention has been particularly shown and described with reference to preferred embodiments thereof, it will be understood by those skilled in the art that various changes in form and details may be made without departing from the spirit and scope of the invention.

The invention claimed is:

1. A method of leakage testing a CMOS driver, comprising:
   a) connecting a bias voltage to a driver portion of a CMOS chip output driver connected to an output pad of said chip;
   b) controlling off said driver portion;
   c) closing a switch circuit coupling said chip pad to a test bus;
   d) coupling a leakage current from said driver portion to a current comparator connected to said test bus;
   e) comparing said leakage current to a reference current in a current comparator;
   f) coupling results of said current comparator to a test result output mechanism;
   g) opening said switch circuit;
   h) continuing to a next said output pad and step c) until said driver portion of all said output pads are tested, then disconnect said bias voltage; and
   i) continuing to said next said driver portion of the chip output drivers, connecting said bias voltage to the next driver portion and returning to step b) until all said next driver portions are tested, then end.

2. The method of claim 1, wherein said driver portion is a P-channel transistor.

3. The method of claim 1, wherein said driver portion is an N-channel transistor.

4. The method of claim 1, wherein said switch circuit is formed from a current mirror circuit whereby an input transistor of said current mirror circuit is formed from said driver portion not being tested in which said input transistor is connected to an output transistor of said current mirror circuit by a switch device.

5. The method of claim 1, wherein said test bus is connected to a test pad to be used by a semiconductor tester.

6. The method of claim 1, wherein said test result output mechanism is a selection of one or more mechanisms, comprising a test I/O pad, a test scan register and a BIST (built-in self test).

7. The method of claim 1, wherein continuing to said next said output pad is not performed until after all said driver portions connected to said output pad are tested and further comprising:
   a) connecting a bias voltage to a driver portion of a CMOS chip output drivers connected to an output pad of said chip;
   b) controlling off said driver portion;
   c) closing said switch circuit coupling said chip pad to a test bus;
   d) coupling a leakage current from said driver portion to a current comparator connected to said test bus;
   e) comparing said leakage current to a reference current in a current comparator;
   f) coupling results of said current comparator to the test result output mechanism;
   g) opening said switch circuit;
   h) disconnecting said bias;
   i) continuing to said next said driver portion of the chip output driver, connecting said bias voltage to the next driver portion and returning to step b) until all said next driver portions are tested; and
   j) continuing to a next said output pad and step a) until said driver portions of all said output pads are tested, then end.

8. The method of claim 1, further comprising:
   a) connecting a positive bias voltage to P-channel driver portions of said CMOS chip output drivers and close all said switches coupling the P-channel driver portions to the test bus to perform a collective leakage measurement by said current comparator; and
   b) connecting a negative bias voltage to N-channel driver portions of said CMOS chip output drivers and close all said switched circuits coupling the N-channel driver portions to the test bus to perform a collective leakage measurement by said current comparator.

9. A method of current testing a CMOS driver, comprising:
   a) connecting a bias voltage to output drivers of a CMOS chip connected to an output pad of said chip;
   b) turning on a test transistor of a portion of said output drivers;
   c) closing a switch circuit coupling said chip pad to a test bus;
   d) coupling a driver current from said test transistor to a current comparator connected to said test bus;
   e) comparing said driver current to a reference current in a current comparator;
   f) coupling results of said current comparator to a test result output mechanism;
   g) turning off said test transistor;
   h) opening said switch circuit;
   i) turning on said test transistor of a next said output driver connected to said output pad and returning to step c) until all said driver portions connected to said output pad are tested; and
   j) continuing to a next said output pad and returning to step b) until all said test transistors connected to all said portions of the output drivers connected to all output pads are tested, then end.

10. The method of claim 9, wherein said portion of the output driver is a P-channel transistor with a segmented gate to form said test transistor of the P-channel transistor.

11. The method of claim 9, wherein said portion of the output driver is an N-channel transistor with a segmented gate to form said test transistor of the N-channel transistor.

12. The method of claim 9, wherein said test bus is connected to a test pad to be used by a semiconductor tester.

13. The method of claim 9, wherein said test result output is coupled to a selection of one or more mechanisms, comprising a test I/O pad, a test scan register and a BIST (built-in self test) circuit.

14. The method of claim 9, wherein said switch circuit is formed from a current mirror circuit whereby an input transistor of said current mirror circuit is formed from said portion of the output drivers not being tested in which said input transistor is connected to an output transistor of said current mirror circuit by a low current switch device.

15. The method of claim 9, wherein continuing to said next said output pad is done after each said driver portion connected to said output pad is measured, and further comprising:
   a) connecting said bias voltage to output drivers of the CMOS chip connected to the output pad of said chip;
   b) turning on a test transistor of a portion of said output driver connected to the output pad;
   c) closing said switch coupling said output pad to the test bus;
   d) coupling said driver current from said test transistor to the current comparator connected to said test bus;
   e) comparing said driver current to the reference current in the current comparator;
   f) coupling results of said current comparator to the test result output mechanism;
   g) turning off said test transistor;
   h) opening said switch;
   i) continuing to the next said output pad and returning to step b) until all said test transistors of said driver portion are tested; and
   j) continuing to said test transistor of the next said output driver, turning on the test transistor of the next said output driver and returning to step c) until all said test transistors connected to all output pads are tested, then end.

16. A CMOS driver test circuit, comprising:
   a) a means for segmenting a control gate of a driver transistor to form a test portion and a driver portion, whereby the test portion of the control gate formed by interconnected plurality of finger shaped elements interleaved with interconnected plurality of finger shaped elements of the driver portion, said plurality finger shaped elements distributed over the width of the driver transistor, wherein width of each of the finger shaped elements of the test portion narrower than each of the finger shaped elements of the driver portion;
   b) a means for turning on said test portion;
   c) a means for coupling an output of said test portion to a measurement circuit; and d) a means for accumulating results of the measurement circuit.

17. The circuit of claim 16, wherein said test portion is formed by said segmented portion of a P-channel driver transistor.

18. The circuit of claim 16, wherein said test portion is formed by said segmented portion of an N-channel driver transistor.

19. The circuit of claim 16, wherein the means for segmenting the control gate of the driver transistor separates the control gate into a plurality of electrically separate portions of which one or more of said electrically separate portions forms said test portion.

20. The circuit of claim 16, wherein the means for turning on said test portion is controlled by a test logic coupled to a selector circuit.

21. The circuit of claim 16, wherein the means for coupling said output to a measurement circuit is a switch circuit coupled to an output pad of a chip.

22. The circuit of claim 21, wherein the measurement circuit is a current comparator contained on said chip.

23. The circuit of claim 21, wherein the measurement circuit is a tester contacting a test pad connected to said output pad.

24. The circuit of claim 16, wherein the means for accumulating results from the measurement circuit is an output mechanism selected from one or more mechanisms, comprising a test I/O pad, a test scan register and a BIST (built-in self test) circuit.

25. A CMOS driver test circuit, comprising:
  a) a means for segmenting a control gate of a driver transistor to form a test transistor portion of said driver transistor;
  b) a means for turning on said test transistor portion;
  c) a means for coupling an output of said test transistor portion to a measurement circuit; and
  d) a means for accumulating results of the measurement circuit.
  e) said means for coupling the output of the test transistor portion to a measurement circuit further comprises a switch circuit formed from a current mirror circuit whereby an input transistor of said current mirror circuit is formed from said driver transistor not being used as said test transistor in which said input transistor is connected to an output transistor of said current mirror circuit by a low current switch device.

* * * * *